United States Patent
Wang et al.

(10) Patent No.: US 9,934,948 B2
(45) Date of Patent: Apr. 3, 2018

(54) MAGNETRON-SPUTTERING COATING SYSTEM AND METHOD, AND DISPLAY SUBSTRATE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xiaokun Wang, Beijing (CN); Sangsoo Park, Beijing (CN); Xunze Zhang, Beijing (CN); Zhaobo Wang, Beijing (CN); Lei Sha, Beijing (CN); Guanjie Cheng, Beijing (CN); Wenjun Zhang, Beijing (CN); Hualu Wang, Beijing (CN); Qingliang Wen, Beijing (CN); Leilei Lv, Beijing (CN)

(73) Assignees: BOE TECHNOLOGY GROUP CO., LTD., Beijing (CN); HEFEI BOE OPTOELECTRONICS TECHNOLOGY CO., LTD., Hefei (CN)

(*) Notice: Subject to any disclaimer, the term of this patent is extended or adjusted under 35 U.S.C. 154(b) by 195 days.

(21) Appl. No.: 14/731,544

(22) Filed: Jun. 5, 2015

(65) Prior Publication Data

US 2016/0186312 A1  Jun. 30, 2016

(30) Foreign Application Priority Data

Dec. 26, 2014  (CN) .......................... 2014 1 0828442

(51) Int. Cl.
*C23C 14/00* (2006.01)
*H01J 37/34* (2006.01)
(Continued)

(52) U.S. Cl.
CPC ...... *H01J 37/3417* (2013.01); *C23C 14/3407* (2013.01); *C23C 14/352* (2013.01);
(Continued)

(58) Field of Classification Search
CPC ..................................................... C23C 14/50
See application file for complete search history.

(56) References Cited

U.S. PATENT DOCUMENTS

| 5,879,827 A * | 3/1999 | Debe ........................ B01J 23/42 204/279 |
| 2009/0017192 A1* | 1/2009 | Matsuura .............. C23C 14/042 427/66 |

(Continued)

FOREIGN PATENT DOCUMENTS

| CN | 201534876 U | 7/2010 |
| CN | 101988189 A | 3/2011 |

(Continued)

OTHER PUBLICATIONS

Office Action in Chinese Patent Application No. 201410828442.5, dated Dec. 28, 2016.
(Continued)

*Primary Examiner* — Timon Wanga
(74) *Attorney, Agent, or Firm* — Brooks Kushman P.C.

(57) ABSTRACT

It is provided a magnetron-sputtering coating system including a sputtering chamber. The sputtering chamber therein includes: a set of target, formed by concatenating a plurality pieces of target; a substrate carrier, arranged to be opposite to the target set, and support a substrate to be coated with a film; and a driving device, arranged to drive the substrate carrier to reciprocate in a direction of the arrangement of the target.

19 Claims, 5 Drawing Sheets

(51) Int. Cl.
   *C23C 14/34*   (2006.01)
   *C23C 14/35*   (2006.01)
   *C23C 14/50*   (2006.01)
   *C23C 14/56*   (2006.01)
   *C23C 14/08*   (2006.01)

(52) U.S. Cl.
   CPC .......... *C23C 14/505* (2013.01); *C23C 14/562* (2013.01); *H01J 37/3447* (2013.01); *H01J 37/3473* (2013.01); *H01J 37/3488* (2013.01); *C23C 14/086* (2013.01)

(56) References Cited

U.S. PATENT DOCUMENTS

| | | |
|---|---|---|
| 2011/0031116 A1 | 2/2011 | Pei |
| 2011/0226612 A1* | 9/2011 | Franz ................... B65G 49/061 204/192.12 |
| 2013/0171757 A1* | 7/2013 | Ponnekanti ............. H01L 31/18 438/57 |
| 2016/0196997 A1* | 7/2016 | White ............... H01L 21/67718 361/234 |

FOREIGN PATENT DOCUMENTS

| | | |
|---|---|---|
| CN | 101996919 A | 3/2011 |
| CN | 103147055 A | 6/2013 |
| CN | 103154304 A | 6/2013 |

OTHER PUBLICATIONS

Office Action in Chinese Patent Application No. 201410828442.5, dated May 3, 2016.
Office Action in Chinese Patent Application No. 201410828442.5, dated Aug. 16, 2016.
Magnetron Sputtering Technology, China Academic Journal Electronic Publishing House, http://www.cnki.net, 1994-2015, 1 page.

* cited by examiner

MAGNETRON-SPUTTERING COATING SYSTEM AND METHOD, AND DISPLAY SUBSTRATE

CROSS REFERENCE OF RELATED APPLICATION

The present application claims the priority of Chinese patent application No. 201410828442.5 filed on Dec. 26, 2014, the disclosure of which is incorporated herein by reference.

TECHNICAL FIELD

The present disclosure relates to a technical field of displaying, and more particular to a magnetron-sputtering coating system, a magnetron-sputtering coating method and a display substrate.

BACKGROUND

In the sixth generation and its above of the magnetron-sputtering coating device, due to a large size of the display substrate, it is conventional to sputter and coat a display substrate with a film by concatenating a plurality of targets to form a target set. Each of the plurality of targets is controlled by an individual power supply, and is independent and insulated from other targets. For the independence and insulation of each target, one target has to be isolated from another target, and an isolation area between two targets is called as a non-sputtering area.

During a process of coating with a film, due to the non-sputtering area between two targets, the film deposited at an area corresponding to a gap between two targets on the substrate is too thin, which leads to that the uniformity and the stability of the film is not satisfied. In particular, for such targets as Indium Gallium Zinc Oxide (IGZO) and Indium Tin Oxide (ITO), if the film corresponding to the gap between two targets is too thin, such defects as Mura phenomenon may appear on the display substrate upon displaying, which may significantly affect the performance and the quality of the display substrate.

SUMMARY

A technical problem to be solved by the present disclosure lies in providing a magnetron-sputtering coating system and a magnetron-sputtering coating method which can effectively improve the uniformity of the film coated on the display substrate, and ensure the performance and the quality of the display substrate.

In the present disclosure, it is provided the following technical solutions for solving the above technical problem.

According to an aspect of the present disclosure, it is provided a magnetron-sputtering coating system. The magnetron-sputtering coating system may include: a sputtering chamber; wherein in the sputtering chamber, the magnetron-sputtering coating system may include: a target set consisting of a plurality of targets; a substrate carrier, arranged opposite to the target set, and configured to support a substrate to be coated with a film; and a driving device, configured to drive the substrate carrier to reciprocate in an arrangement direction of the targets.

Alternatively, the magnetron-sputtering coating system may further include: a chamber mask arranged to surround the substrate carrier which moves within the chamber mask.

Alternatively, the magnetron-sputtering coating system may further include: an edge mask arranged on both sides of the substrate carrier in the arrangement direction of the targets.

Alternatively, the driving device may include: rollers configured to drive the substrate carrier to move; a motor configured to drive the rollers to rotate; and a controller connected to the motor and configured to control a rotation rate of the rollers so as to control a movement speed of the substrate carrier.

Alternatively, the magnetron-sputtering coating system may further include: a plurality of position sensors arranged in the arrangement direction of the targets and configured to detect a position of the substrate carrier.

Alternatively, the magnetron-sputtering coating system may further include: a limiting position sensor arranged at an edge of the sputtering chamber.

Alternatively, the magnetron-sputtering coating system may further include: a process gas supplier connected to the sputtering chamber and configured to supply a process gas to the sputtering chamber.

Alternatively, the process gas may include an argon gas and/or an oxygen gas.

Alternatively, the movement speed of the substrate carrier is determined based on a time duration where a steady pressure is kept within the sputtering chamber; wherein the longer the time duration of the steady pressure is, the slower the movement speed is; and the shorter the time duration of the steady pressure is, the faster the movement speed is.

Alternatively, a relative movement speed between the substrate carrier and the target set is slower than a speed of atoms or an atomic cluster within a plasma body upon the substrate being coated with a film.

According to another aspect of the present disclosure, it is provided a magnetron-sputtering coating method implemented by a magnetron-sputtering coating system. The magnetron-sputtering coating system may include: a sputtering chamber; and further include, in the sputtering chamber, a target set consisting of a plurality of targets; a substrate carrier arranged opposite to the target set and configured to support a substrate to be coated with a film; and a driving device configured to drive the substrate carrier to reciprocate in an arrangement direction of the targets. The method may include a step of: reciprocating the substrate carrier supporting the substrate to be coated with a film in the arrangement direction of the targets, upon the substrate being coated with the film.

Alternatively, the method may further include, prior to coating the substrate with the film, a step of: introducing a process gas into the sputtering chamber, and keeping a predetermined pressure within the sputtering chamber for predetermined time duration.

Alternatively, the process gas may include an argon gas and/or an oxygen gas.

Alternatively, when the substrate carrier moves at a constant speed, a movement speed V of the substrate carrier may be calculated by: $V=S/(T1-T2)$; wherein one travel indicates that the substrate carrier supporting the substrate to be coated with the film moves from one side to the other side within the sputtering chamber, S indicates a traveling distance representing a distance traveled by the substrate carrier during the one travel, T1 indicates a time duration equal to the time duration for the coating divided by the number of travels, and T2 indicates a sum of an accelerating time duration of the substrate carrier and a decelerating time duration of the substrate carrier during one travel.

Alternatively, the magnetron-sputtering coating system may include a chamber mask arranged to surround the substrate carrier; and upon the substrate being coated with the film, the substrate carrier is caused to move within the chamber mask, so as to prevent the targets from being sputtered into the sputtering chamber.

Alternatively, the magnetron-sputtering coating system may include an edge mask arranged on both sides of the substrate carrier in the arrangement direction of the targets, so as to prevent the target from being sputtered onto the substrate carrier upon the substrate being coated with the film.

Alternatively, a predetermined pressure may be kept within the sputtering chamber for about 30 seconds.

Alternatively, wherein the movement speed of the substrate carrier may be determined based on a time duration where a steady pressure is kept within the sputtering chamber; wherein the longer the time duration of the steady pressure is, the slower the movement speed is; and the shorter the time duration of the steady pressure is, the faster the movement speed is.

Alternatively, a relative movement speed between the substrate carrier and the target set may be slower than a speed of atoms or an atomic cluster within a plasma body upon the substrate being coated with a film.

According to a third aspect of the present disclosure, it is provided a display substrate. The display substrate may include a film manufactured by the above magnetron-sputtering coating method.

In the embodiments of the present disclosure, the following technical effects may be obtained.

In the above technical solutions, the main structure of the magnetron-sputtering coating device is not affected, while the driving device drives the substrate carrier to reciprocate in an arrangement direction of the targets, so that the substrate to be coated with the film reciprocates relative to the targets, the non-sputtering area and the sputting area alternates on the substrate to be coated with the film during the coating process, and the film on the non-sputtering area may be shared and supplemented by the reciprocation of the substrate. As a result, it is manufactured more uniform film with more stable performance. Furthermore, the relative movement speed between the substrate and the targets is far slower than a speed of atoms or an atomic cluster within a plasma body upon the substrate being coated with the film. Thus, in contrast to the film manufactured by the conventional magnetron-sputtering method, the quality of the film according to the technical solutions of the present disclosure is much better.

DETAILED DESCRIPTION

Figure 1:
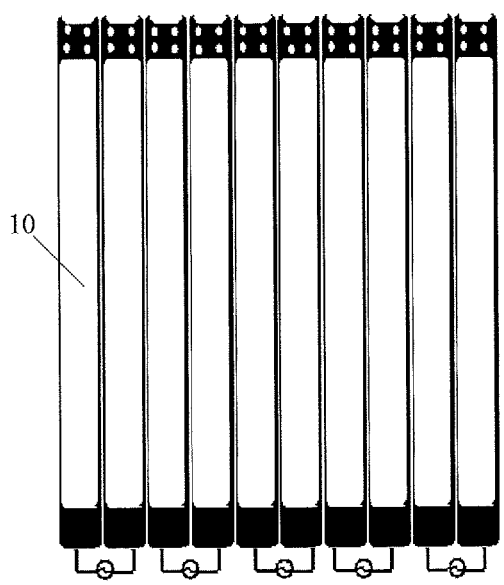
FIG. 1 illustrates a target set consisting of a plurality of targets.

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In embodiments of the present disclosure, it is provided a magnetron-sputtering coating system and a magnetron-sputtering coating method which may effectively improve the uniformity of the film coated on the display substrate, and ensure the performance and the quality of the display substrate.

In the embodiments of the present disclosure, it is provided a magnetron-sputtering coating system including: a sputtering chamber. And the sputtering chamber therein includes:

a target set consisting of a plurality of targets;

a substrate carrier, arranged opposite to the target set, and configured to support a substrate to be coated with a film; and a driving device, configured to drive the substrate carrier to reciprocate in an arrangement direction of the targets.

In this embodiment, the main structure of the magnetron-sputtering coating device is not affected, while the driving device drives the substrate carrier to reciprocate in an arrangement direction of the targets, so that the substrate to be coated with the film reciprocates relative to the targets, the non-sputtering area and the sputting area alternate on the substrate to be coated with the film during the coating process, and the film on the non-sputtering area may be shared and supplemented by the reciprocation of the substrate. As a result, it is manufactured more uniform film with more stable performance. Furthermore, the relative movement speed between the substrate and the targets is far slower than a speed of atoms or an atomic cluster within a plasma body upon the substrate being coated with the film. Thus, in contrast to the film manufactured by the conventional magnetron-sputtering method, the quality of the film according to the technical solutions of the present disclosure is much better.

In addition, the system may further include:

a chamber mask arranged to surround the substrate carrier which moves within the chamber mask, so as to prevent the targets from being sputtered into the sputtering chamber.

In addition, the system may further include:

an edge mask arranged on both sides of the substrate carrier in the arrangement direction of the targets, so as to prevent the targets from being sputtered onto the substrate carrier.

In particular, the driving device may include:

rollers configured to drive the substrate carrier to move;

a motor configured to drive the rollers to rotate;

a controller connected to the motor and configured to control a rotation rate of the rollers so as to control a movement speed of the substrate carrier.

In addition, the system may further include:

a plurality of position sensors arranged in the arrangement direction of the targets and configured to detect a position of the substrate carrier. The position sensors may detect the position of the substrate carrier, and ensure the quality of the substrate carrier within the sputtering chamber.

In addition, the system may further include:

a limiting position sensor arranged at an edge of the sputtering chamber. The limiting position sensor may detect a position of the substrate carrier having moved to a limiting distance, and ensure the quality of the substrate carrier within the sputtering chamber.

In embodiments of the present disclosure, it is further provided a magnetron-sputtering coating method which is applied to the magnetron-sputtering coating system. The method may include:

reciprocating the substrate carrier supporting the substrate to be coated with a film in the arrangement direction of the targets, upon the substrate being coated with the film.

In this embodiment, the main structure of the magnetron-sputtering coating device is not affected, while the driving device drives the substrate carrier to reciprocate in an arrangement direction of the targets, so that the substrate to be coated with the film reciprocates relative to the targets, the non-sputtering area and the sputting area alternate on the substrate to be coated with the film during the coating process, and the film on the non-sputtering area may be shared and supplemented by the reciprocation of the substrate. As a result, it is manufactured more uniform film with more stable performance. Furthermore, the relative movement speed between the substrate and the targets is far slower than a speed of atoms or an atomic cluster within a plasma body upon the substrate being coated with the film. Thus, in contrast to the film manufactured by the conventional magnetron-sputtering method, the quality of the film according to the technical solutions of the present disclosure is much better.

In addition, the method may further include, prior to the substrate being coated with the film, a step of:

introducing a process gas into the sputtering chamber, and keeping a predetermined pressure within the sputtering chamber for a predetermined time duration.

In particular, the process gas may include but is not limited to an argon gas and an oxygen gas.

Furthermore, when the substrate carrier moves at a constant speed, a movement speed V of the substrate carrier is calculated by: $V=S/(T1-T2)$;

where one travel indicates that the substrate carrier supporting the substrate to be coated with the film moves from one side to the other side within the sputtering chamber, S indicates a traveling distance representing a distance traveled by the substrate carrier during the one travel, T1 indicates a time duration equal to the time duration for the coating divided by the number of travels, and T2 indicates a sum of an accelerating time duration of the substrate carrier and a decelerating time duration of the substrate carrier during one travel.

In the following, the magnetron-sputtering coating method and system of the present disclosure will be explained in details in conjunction with figures and specific embodiments.

As illustrated in FIG. 1, in the sixth generation and its above of the magnetron-sputtering coating device, it is conventional to sputter a display substrate and coat it with a film by concatenating a plurality of targets to form a target set 10 due to a large size of the display substrate. Each of the plurality of targets is controlled by an individual power supply, and is independent and insulated from each other. For the independence and insulation of each target, one target has to be isolated from another target, and an isolation area between two targets is a non-sputtering area. Typically, a width of the non-sputtering area is not less than 2 mm.

Figure 2:
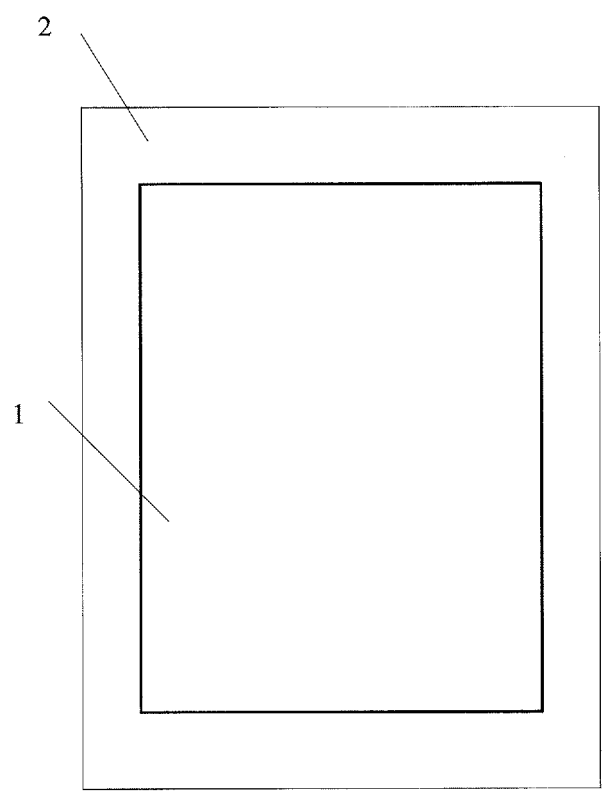
FIG. 2 illustrates a substrate carrier supporting a substrate in a conventional magnetron-sputtering coating device.

Typically, a conventional magnetron-sputtering coating method adopts static coating with a film. As illustrated in FIG. 2, a substrate carrier 2 is provided for supporting the substrate 1 to be coated with a film in the sputtering chamber. During the coating process, the substrate carrier 2 is kept stationary. A chamber mask 6 is provided at outside of the substrate 1 for preventing plasma from being sputtered onto the chamber and the substrate carrier 2. A size of the chamber mask 6 coincides with the size of the substrate 1. After the coating, a thickness of the film deposited at an area corresponding to a position of the non-sputtering area on the substrate 1 is thinner than the thickness of the film deposited at other areas, which results in that the uniformity and the stability of the film is not satisfied.

Figure 3:
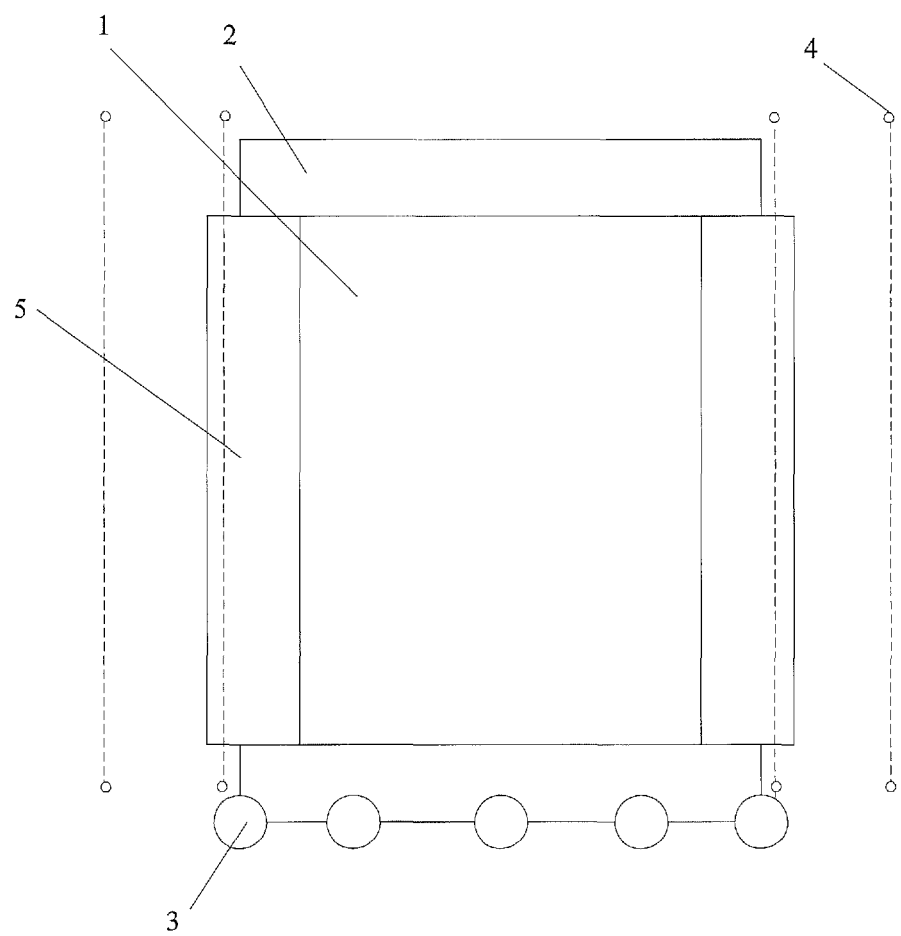
FIG. 3 and FIG. 4 illustrate a structure of the magnetron-sputtering coating system according to an embodiment of the present disclosure.
Figure 4:
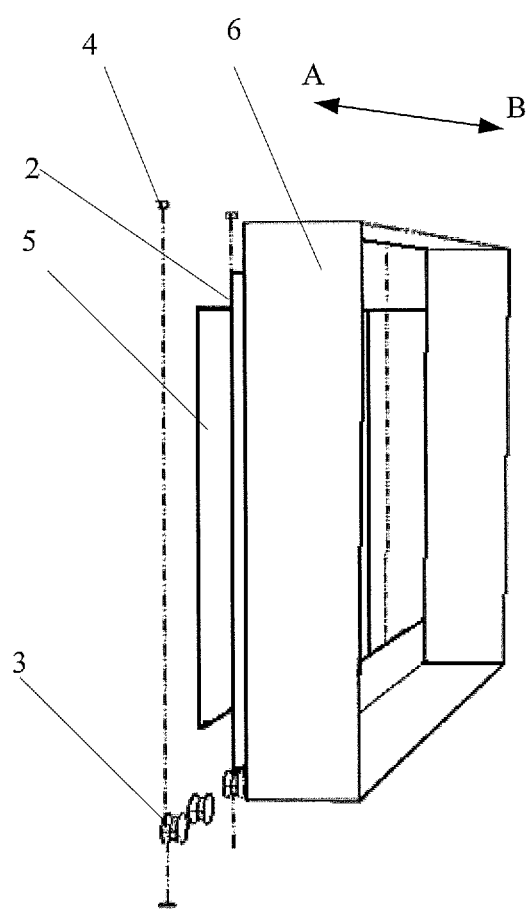

For solving such technical problems, it is provided a magnetron-sputtering coating system in the embodiment of the present disclosure. As illustrated in FIG. 3 and FIG. 4, the magnetron-sputtering coating system includes the sputtering chamber according to this embodiment. The sputtering chamber includes therein: a set of targets consisting of a plurality of targets; a substrate carrier 2 arranged opposite to the target set and configured to support a substrate to be coated with a film; a driving device arranged to drive the substrate carrier 2 to reciprocate in a arrangement direction of the targets, and carry the substrate carrier 2 into the sputtering chamber; a chamber mask 6 arranged to surround the substrate carrier 2 which moves within the chamber mask 6 during the coating process, and prevent the targets from being sputtered into the sputtering chamber, due to a dynamic coating in the present embodiment; an edge mask 5 arranged on both sides of the substrate 1 to be coated with a film in the arrangement direction of the targets, and prevent the targets from being sputtered onto the substrate carrier 2 during the coating process. Here the driving device includes: rollers 3 arranged to drive the substrate carrier 2 to move; a motor arranged to drive the rollers 3 to rotate; and a controller connected to the motor, and configured to control a rotation rate of the rollers 3 so as to control a movement speed of the substrate carrier 2. In addition, a plurality of position sensors 4 are provided at both sides of the sputtering chamber for ensuring the movement of the carrier substrate 2 in the sputtering chamber and the quality of the carrier substrate 2, and detect a position of the substrate carrier 2. If the carrier substrate 2 is not moving in a predetermined manner, the position sensors 4 may alarm. Further, a limiting position sensor may be provided at an edge of the sputtering chamber. The limiting position sensor may detect a position of the substrate carrier having moved to a limiting distance. If the limiting position sensor detects the substrate carrier 2, it is determined that the position of the substrate carrier 2 is beyond the range for sputtering targets, and the limiting position sensors may alarm, so as to ensure the quality of the substrate carrier within the sputtering chamber. With the aid of such sensors, it is ensured that the carrier substrate 2 is driven to travel according to a scheme during the coating process.

In addition, the magnetron-sputtering coating system may further include a process gas supplier (not shown) in this embodiment. The process gas supplier is arranged to be connected to the sputtering chamber and supply a process gas to the sputtering chamber. In particular, the process gas includes but is not limited to an argon gas and an oxygen gas.

In this embodiment, a working procedure of the magnetron-sputtering coating system may include the following steps:

Step 1, the driving device drives the substrate carrier 2 to move, so as to carry the substrate 1 to be coated with the film into the sputtering chamber, and a valve of the sputtering chamber is closed;

Step 2, the process gas such as an argon gas or an oxygen gas is introduced into the sputtering chamber and a predetermined steady pressure within the sputtering chamber is kept for a time duration, which may be about 30 seconds, so as to ensure the stability of the pressure during the coating;

Step 3, when the process gas is introduced, the substrate carrier 2 moves from a central position to a side A in the sputtering chamber, as illustrated in FIG. 4. The movement speed of the substrate carrier 2 is determined based on a time duration where steady pressure is kept within the sputtering chamber. Specifically, the longer the time duration of the steady pressure is, the slower the movement speed is; and the shorter the time duration of the steady pressure is, the faster the movement speed is. The substrate carrier 2 is required to have been moved to the side A or the side B at the moment of achieving the steady pressure;

Step 4, after the stabilization of the pressure, the power supply begins to discharge and the coating process starts. Specifically, the time duration for discharging may be predetermined based on a thickness of the film to be coated.

Step 5, during the discharging, the substrate carrier 2 supporting the substrate 1 starts to reciprocate between side A and side B in the sputtering chamber; one travel indicates that the substrate carrier supporting the substrate moves from side A to side B or from side B to side A, and the number of the travels during the coating is predetermined. During the travels of the substrate carrier 2, the position of the substrate carrier 2 may be detected by the position sensors 4, and the movement direction of the substrate carrier 2 may be adjusted based on the position of the substrate carrier 2. For example, when the substrate carrier 2 reaches side B, the movement direction of the substrate carrier 2 is adjusted, so that the substrate carrier 2 will move towards side A. Furthermore, the limiting movement position of the substrate carrier 2 may be detected by the limiting position sensor to prevent the substrate carrier 2 from moving out of the range for sputtering targets.

Figure 5:
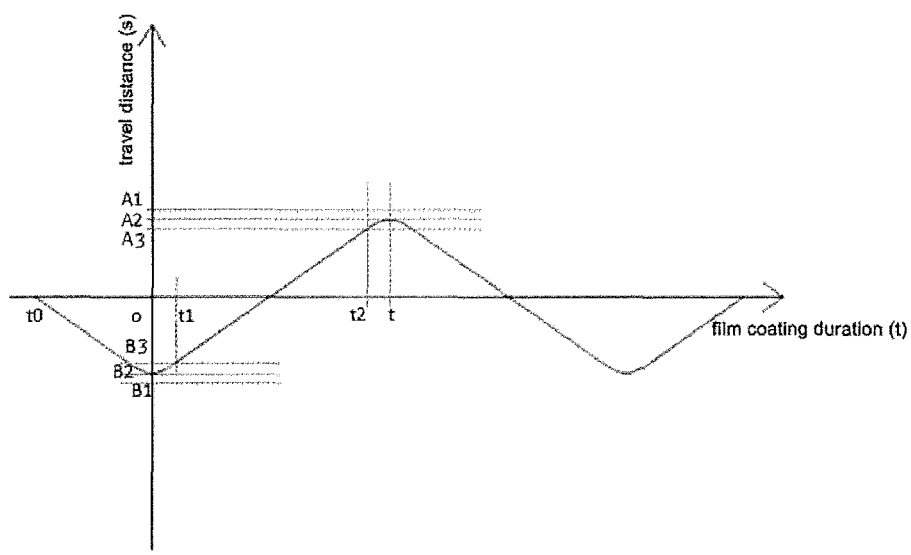
FIG. 5 illustrates a relation between a traveling distance and a coating duration time according to an embodiment of the present disclosure.

Specifically, the controller may control the movement speed of the substrate carrier 2 (i.e. the movement speed of the substrate 1) by controlling the rotational speed of the motor. FIG. 5 illustrates a relation between a traveling distance and a coating time duration according to an embodiment of the present disclosure. As illustrated in FIG. 5, A1 indicates a limiting movement position of the substrate carrier 2 at the side A, B1 indicates a limiting movement position of the substrate carrier 2 at the side B, A2 indicates a maximum movement position of the substrate carrier 2 at the side A, B2 indicates a maximum movement position of the substrate carrier 2 at the side B, t indicates a time duration required for one travel of the substrate carrier 2, t1 indicates a timing when the substrate carrier 2 moves to a position B3, t2 indicates a timing when the substrate carrier 2 moves to a position A3, and the substrate carrier 2 moves at a constant speed between the position A3 and the position B3.

The movement speed V of the substrate carrier 2 is automatically calculated by the controller based on a predetermined number of travels and the travel distance (i.e. the distance from the side A to the side B), and the equation for such calculation may be as follows:

$V=S/(T1-T2)$, where the movement speed of the substrate carrier 2 is V, and the travel distance is S;

where T1 indicates a time duration equal to the time duration for the coating divided by the number of travels, and T2 indicates a sum of an accelerating time duration of the substrate carrier 2 and a decelerating time duration of the substrate carrier 2 during one travel.

Step 6, at the end of discharging, the substrate carrier 2 has just moved to the side A or the side B within the sputtering chamber; and after the discharging, the substrate carrier 2 starts to move to the central position within the sputtering chamber; and Step 7, the valve of the sputtering carrier opens after the substrate carrier 2 moves to the central position, and the substrate carrier 2 carries the substrate 1 having been coated with the film to leave the sputtering chamber in a conventional manner, and the coating process ends. Thus, the film with predetermined thickness is formed on the substrate 1.

Furthermore, it is provided a display substrate including the film manufactured by the magnetron-sputtering coating method. Comparing with the film manufactured by the conventional magnetron-sputtering method, it is manufactured more uniform film with more stable performance according to the embodiments of the present disclosure, and the quality thereof is much better.

In the above embodiments, the main structure of the magnetron-sputtering coating device is not affected, while the movement assembly drives the substrate carrier to reciprocate in an arrangement direction of the targets, so that the substrate to be coated with the film reciprocates relative to the targets, the non-sputtering area and the sputting area alternate on the substrate to be coated with the film during the coating process, and the film on the non-sputtering area may be shared and supplemented by the reciprocation of the substrate. As a result, it is manufactured more uniform film with more stable performance. Furthermore, the relative movement speed between the substrate and the targets is far slower than a speed of atoms or an atomic cluster within a plasma body upon the substrate being coated with the film Thus, in contrast to the film manufactured by the conventional magnetron-sputtering method, the quality of the film according to the technical solutions of the present disclosure is much better.

The optional embodiments of the present disclosure have been discussed. It is appreciated that many modifications and polishes may be made to the present disclosure without departing from the principle of the present disclosure for those skilled in the art. These modifications and polishes should also be deemed to be fallen within the scope of the present disclosure.

What is claimed is:

1. A magnetron-sputtering coating system, comprising:
    a sputtering chamber,
    wherein in the sputtering chamber, the magnetron-sputtering coating system further comprises:
    a target set consisting of a plurality of targets;
    a substrate carrier, arranged opposite to the target set, and configured to support a substrate to be coated with a film;

a driving device, configured to drive the substrate carrier to reciprocate in an arrangement direction of the targets; and a chamber mask arranged to surround the substrate carrier, the substrate carrier configured to move relative to and within the chamber mask.

2. The magnetron-sputtering coating system according to claim 1, further comprising:

an edge mask arranged on both sides of the substrate carrier in the arrangement direction of the targets.

3. The magnetron-sputtering coating system according to claim 1, wherein the driving device comprises:

rollers configured to drive the substrate carrier to move;
a motor configured to drive the rollers to rotate; and
a controller connected to the motor and configured to control a rotation rate of the rollers so as to control a movement speed of the substrate carrier.

4. The magnetron-sputtering coating system according to claim 1, further comprising:

a plurality of position sensors arranged in the arrangement direction of the targets and configured to detect a position of the substrate carrier.

5. The magnetron-sputtering coating system according to claim 4, further comprising:

a limiting position sensor arranged at an edge of the sputtering chamber.

6. The magnetron-sputtering coating system according to claim 1, further comprising:

a process gas supplier connected to the sputtering chamber and configured to supply a process gas to the sputtering chamber.

7. The magnetron-sputtering coating system according to claim 6, wherein the process gas comprises an argon gas and/or an oxygen gas.

8. The magnetron-sputtering coating system according to claim 1, wherein the movement speed of the substrate carrier is determined based on a time duration where a steady pressure is kept within the sputtering chamber;

wherein the longer the time duration is, the slower the movement speed is; and
the shorter the time duration is, the faster the movement speed is.

9. The magnetron-sputtering coating system according to claim 1, wherein a relative movement speed between the substrate carrier and the target set is slower than a speed of atoms or an atomic cluster within a plasma body upon the substrate being coated with the film.

10. A magnetron-sputtering coating method implemented by a magnetron-sputtering coating system, the magnetron-sputtering coating system comprising a sputtering chamber; and further comprising, in the sputtering chamber, a target set consisting of a plurality of targets, a substrate carrier arranged opposite to the target set and configured to support a substrate to be coated with a film, a driving device configured to drive the substrate carrier to reciprocate in an arrangement direction of the targets, and a chamber mask arranged to surround the substrate carrier, the substrate carrier being configured to move relative to and within the chamber mask, the method comprising:
reciprocating the substrate carrier supporting the substrate to be coated with a film in the arrangement direction of the targets to coat the substrate with a film.

11. The magnetron-sputtering coating method according to claim 10, further comprising, prior to coating the substrate with the film, a step of:

introducing a process gas into the sputtering chamber, and keeping a predetermined pressure within the sputtering chamber for a predetermined time duration.

12. The magnetron-sputtering coating method according to claim 11, wherein the process gas comprises an argon gas and/or an oxygen gas.

13. The magnetron-sputtering coating method according to claim 10, wherein:

when the substrate carrier moves at a constant speed, a movement speed V of the substrate carrier is calculated by: $V=S/(T1-T2)$;
wherein one travel indicates that the substrate carrier supporting the substrate to be coated with the film moves from one side to the other side within the sputtering chamber, S indicates a traveling distance representing a distance traveled by the substrate carrier during the one travel, T1 indicates a time duration equal to the time duration for the coating divided by the number of travels, and T2 indicates a sum of an accelerating time duration of the substrate carrier and a decelerating time duration of the substrate carrier during one travel.

14. The magnetron-sputtering coating method according to claim 10, wherein:

the magnetron-sputtering coating system comprises a chamber mask arranged to surround the substrate carrier; and upon the substrate being coated with the film, the substrate carrier is caused to move within the chamber mask, so as to prevent the targets from being sputtered into the sputtering chamber.

15. The magnetron-sputtering coating method according to claim 10, wherein:

the magnetron-sputtering coating system comprises an edge mask arranged on both sides of the substrate carrier in the arrangement direction of the targets, so as to prevent the targets from being sputtered onto the substrate carrier upon the substrate being coated with the film.

16. The magnetron-sputtering coating method according to claim 11, wherein a predetermined pressure is kept within the sputtering chamber for about 30 seconds.

17. The magnetron-sputtering coating method according to claim 16, wherein the movement speed of the substrate carrier is determined based on the time duration where a steady pressure is kept within the sputtering chamber;

wherein the longer the time duration is, the slower the movement speed is; and
the shorter the time duration is, the faster the movement speed is.

18. The magnetron-sputtering coating method according to claim 10, wherein a relative movement speed between the substrate carrier and the target set is slower than a speed of atoms or an atomic cluster within a plasma body upon the substrate being coated with a film.

19. A display substrate, comprising a film manufactured by a magnetron-sputtering coating method implemented by a magnetron-sputtering coating system, the magnetron-sputtering coating system comprising a sputtering chamber; and further comprising, in the sputtering chamber, a target set consisting of a plurality of targets, a substrate carrier arranged opposite to the target set and configured to support a substrate to be coated with a film, a driving device configured to drive the substrate carrier to reciprocate in an arrangement direction of the targets, and a chamber mask surrounding the substrate carrier and configured to enable the substrate carrier to move relative to and within the chamber mask, the method comprising: reciprocating the substrate carrier supporting the substrate to be coated with a film in the arrangement direction of the targets to coat the substrate with a film.

* * * * *